(12) United States Patent
Kapur et al.

(10) Patent No.: US 9,595,622 B2
(45) Date of Patent: Mar. 14, 2017

(54) STRUCTURES AND METHODS FOR HIGH-EFFICIENCY PYRAMIDAL THREE-DIMENSIONAL SOLAR CELLS

(71) Applicant: Solexel, Inc., Milpitas, CA (US)

(72) Inventors: Pawan Kapur, Burlingame, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 132 days.

(21) Appl. No.: 14/601,123

(22) Filed: Jan. 20, 2015

(65) Prior Publication Data

US 2015/0325714 A1 Nov. 12, 2015

Related U.S. Application Data

(63) Continuation of application No. 12/615,383, filed on Nov. 10, 2009, now Pat. No. 8,937,243, which is a
(Continued)

(51) Int. Cl.
| | |
|---|---|
| *H01L 31/0352* | (2006.01) |
| *H01L 31/0224* | (2006.01) |
| *H01L 31/0216* | (2014.01) |
| *H01L 31/068* | (2012.01) |
| *H01L 31/18* | (2006.01) |
| *H01L 31/0236* | (2006.01) |
| *H01L 31/0445* | (2014.01) |

(52) U.S. Cl.
CPC ........... *H01L 31/022425* (2013.01); *H01L 31/02167* (2013.01); *H01L 31/02363* (2013.01); *H01L 31/02366* (2013.01); *H01L 31/03529* (2013.01); *H01L 31/035281* (2013.01); *H01L 31/0445* (2014.12); *H01L 31/068* (2013.01); *H01L 31/182* (2013.01); *H01L 31/1896* (2013.01); *Y02E 10/546* (2013.01); *Y02E 10/547* (2013.01); *Y02P 70/521* (2015.11)

(58) Field of Classification Search
CPC .......... H01L 31/022425; H01L 31/068; H01L 31/1896; H01L 31/182; H01L 31/02366; H01L 31/03529; H01L 31/02363
See application file for complete search history.

(56) References Cited

U.S. PATENT DOCUMENTS

| | | | | |
|---|---|---|---|---|
| 3,936,319 | A * | 2/1976 | Anthony | ............... H01L 21/242 117/40 |
| 4,147,564 | A * | 4/1979 | Magee | ................ H01L 21/263 136/256 |

(Continued)

*Primary Examiner* — Golam Mowla
(74) *Attorney, Agent, or Firm* — John Wood (57) ABSTRACT

The present disclosure enables high-volume cost effective production of three-dimensional thin film solar cell (3-D TFSC) substrates. Pyramid-like unit cell structures 16 and 50 enable epitaxial growth through an open pyramidal structure 3-D TFSC embodiments 70, 82, 100, and 110 may be combined as necessary. A basic 3-D TFSC having a substrate, emitter, oxidation on the emitter, and front and back metal contacts allows for simple processing. Other embodiments disclose a selective emitter, selective backside metal contacts, and front-side SiN ARC layers. Several processing methods, including process flows 150, 200, 250, 300, and 350, enable production of these 3-D TFSCs.

21 Claims, 11 Drawing Sheets

Related U.S. Application Data continuation-in-part of application No. 11/868,494, filed on Oct. 6, 2007, now Pat. No. 8,035,027.

(60) Provisional application No. 60/886,303, filed on Jan. 24, 2007, provisional application No. 60/828,678, filed on Oct. 9, 2006.

(56) References Cited

U.S. PATENT DOCUMENTS

| | | | | |
|---|---|---|---|---|
| 4,227,942 A | * | 10/1980 | Hall | H01L 31/02245 136/255 |
| 4,427,839 A | * | 1/1984 | Hall | H01L 31/02245 136/255 |
| 4,608,451 A | * | 8/1986 | Landis | H01L 31/0236 136/256 |
| 5,024,953 A | * | 6/1991 | Uematsu | H01L 21/3083 136/255 |
| 6,127,623 A | * | 10/2000 | Nakamura | H01L 31/0236 136/256 |
| 2008/0230122 A1 | * | 9/2008 | Terakawa | H01L 31/0236 136/261 |
| 2009/0107545 A1 | * | 4/2009 | Moslehi | H01L 31/042 136/256 |

* cited by examiner

FIG. 12

STRUCTURES AND METHODS FOR HIGH-EFFICIENCY PYRAMIDAL THREE-DIMENSIONAL SOLAR CELLS

CROSS-REFERENCE TO RELATED APPLICATION

This application is a continuation of U.S. patent application Ser. No. 12/615,383 filed Nov. 10, 2009 which is a continuation-in-part of Ser. No. 11/868,494 filed Oct. 6, 2007 now U.S. Pat. No. 8,035,027 issued Oct. 11, 2011 which claims benefit of provisional application No. 60/886,303 filed Jan. 24, 2007 and 60/828,678 filed Oct. 9, 2006, all of which are hereby incorporated by reference in their entirety.

FIELD

This disclosure relates in general to the field of solar cells and solar cell manufacturing. More particularly, the disclosure relates to enhanced three-dimensional thin film solar cells and methods of manufacturing the same.

DESCRIPTION OF THE RELATED ART

Three-dimensional thin film solar cell (3-D TFSC) substrates afford many benefits over their two-dimensional counter parts including enhanced efficiency, better mechanical strength, and reduced cost.

References is now made to co-pending U.S. patent application Ser. No. 11/868,490, entitled "THREE DIMENSIONAL SOLAR CELLS," (the "'490 application) having common inventor with the present disclosure and which is here expressly incorporated by reference. In one embodiment, the application discloses a prism shaped unit cell structure which may be created using a template.

The '490 application discloses a prism shaped unit cell structure which by its three-dimensional nature increases light trapping and through the processes disclosed in the '490 application reduce manufacturing cost. By creating a re-usable template, 3-D TFSC substrates can be manufactured at high throughput rates while reducing manufacturing complexity and cost. Further, the honeycomb structure disclosed in the '490 structure the mechanical strength of the substrate enabling processing of free standing substrates.

Despite these advantages, further advantages in 3-D TFSC structures and manufacturing processes may still be made. Because of the high aspect-ratio, the prism structure may be difficult to create during the epitaxial growth process. A structure that enables less complexity during the epitaxial growth process may substantially reduce substrate cost. In addition, the large surface area of the prism structure may lead to recombination losses at the surface. By reducing the surface area, and thus recombination losses, $V_{OC}$ may be increased.

Further, the template used in the manufacturing process should be kept free of defects to ensure defect free end of the line 3-D substrates. A manufacturing process which mitigates defects in the template may increase yield. A manufacturing process which reduces and removes steps of known processes could increase yield, throughput, and decrease manufacturing cost and complexity.

To keep the backside of the substrate protected, additional processing may be required. These additional steps may be costly, decrease yield, and decrease throughput.

SUMMARY

Therefore, a need has arisen for a three-dimensional thin film solar cell (3-D TFSC) structures and manufacturing processes which enable less complexity, increased efficiency, and decrease processing cost. A manufacturing process which enables significant processing in the template increases yield by mitigating substrate breakage concern. Such a process also eliminates steps needed to keep the backside of the substrate protected during processing, since the template itself shields the backside of the substrate.

The present disclosure presents a three-dimensional pyramid structure, which through its open structure, enables cost effective epitaxial growth in the template. The relative openness of the pyramid structure further enables its removal from the template. In addition, manufacturing processes disclosed herein enable processing in the mother template allowing increased yield and reducing processing steps.

A pyramid structure having tapered sidewalls and an open pyramid-like structure is presented. A 3-D TFSC substrate having a number of such structures or unit cells provides better efficiency and reduced cost in the manufacturing process. Further, the present disclosure provides four embodiments of the structure that may be used depending on the cost versus efficiency criteria of the manufacturer.

First, a basic structure having an n-type epitaxial substrate is presented. The basic structure further includes pyramid-like unit cells, an emitter region on the front of the substrate, a thermal oxide passivation layer formed on the emitter layer, a blanket metal contact formed on the back of the substrate, and front metal contacts formed on the top-ridges of the unit cells.

Next, three efficiency increasing embodiments expand the basic structure. In one embodiment, a selective emitter formed under the metal contacts of the top-ridges minimizes dark current density ($J_0$). In another embodiment, an oxide passivated backside of the substrate minimizes recombination losses thereby increasing $V_{OC}$. This is achieved by isolating the back metal from silicon in most places except in limited places where it is connected through holes in the oxide. The blanket metal goes on top of the passivation (oxide in this embodiment) and touches silicon to make an affective ohmic contact, in limited areas where the oxide is intentionally removed. In another efficiency boosting embodiment, a front-side SiN ARC layer above the oxide passivation layer reduces reflective losses. Further, the SiN ARC layer serves as a hydrogen source to passivate the front side. These embodiments may be combined or produced separately as manufacturing constraints dictate.

The present disclosure also provides several novel manufacturing methods to produce the four embodiments disclosed. A tip-etch process enables production of all embodiments. A Ag Fire through process enables production of the basic structure, the selective back contact structure, and the SiN ARC structure. A liquid transfer coating process enables production of the selective emitter structure, the selective back contact structure, and the SiN ARC structure.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference numerals indicate like features and wherein.

DETAILED DESCRIPTION OF THE ILLUSTRATIVE EMBODIMENTS

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

A preferred semiconductor material for the 3-D TFSC is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials such as germanium, silicon germanium, silicon carbide, a crystalline compound semiconductor, or a combination thereof. Additional applications include copper indium gallium selenide (CIGS) and cadmium telluride semiconductor thin films.

Figure 1A:
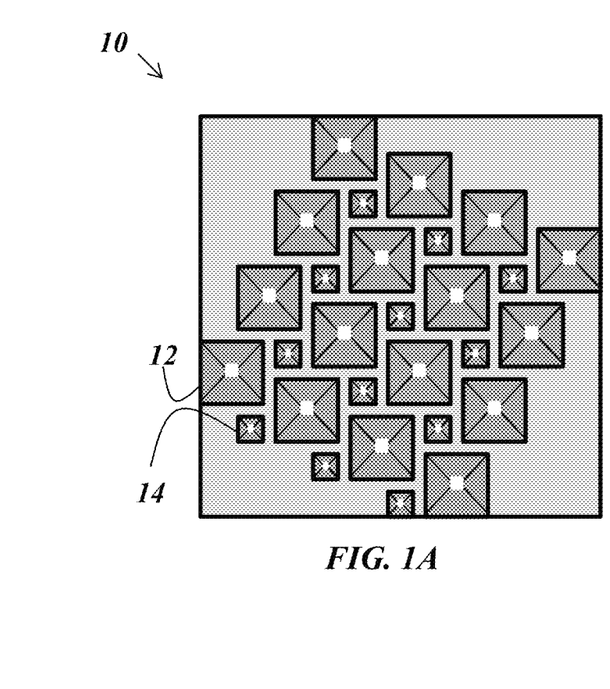
FIGS. 1A and 1B disclose a pyramid-like unit cell having no flat base region.
Figure 1B:
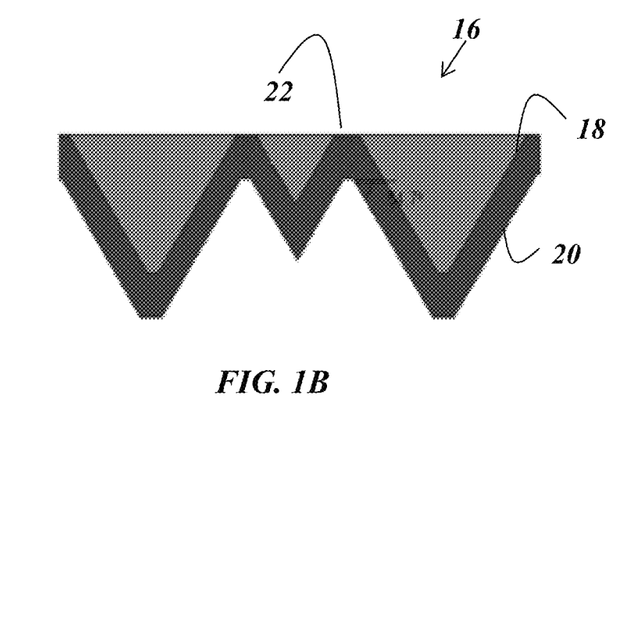

FIGS. 1A and 1B show top and cross-sectional views of the 3-D TFSC substrate and the pyramid-like structure of the present disclosure. FIG. 1A shows a top view of 3-D TFSC substrate 10 having two sizes 12 and 14 of pyramidal unit cell structure 16 shown in FIG. 1B. A change in the template design may facilitate the creation any desired pattern. The basic pyramidal unit cell may be used in combination with other unit cell shapes and sizes. Other embodiments may include, but are not limited to, different sized of the small and large pyramids in the unit cell or having one or more than two types of pyramids in the unit cell.

FIG. 1B shows pyramid-like unit cell 16 with tapered sidewalls 18, backside 20, and top-ridge 22. As shown, pyramid-like unit 16 does not have a flat base portion In the preset embodiment, the Tapered sidewalls 18 have a <111> crystallographic plane while top-ridges 20 have a <100> crystallographic plane. It is entirely possible that the sidewall may be a different crystallographic orientation or a mixture of different orientations. Oxide formation processes may exploit this difference to produce different oxide thicknesses on these planes. An oxide formation step will selectively form a thicker oxide layer on tapered sidewalls 18 due to their crystallographic orientation. A timed HF solution may selectively remove oxide from top-ridges 18 while preserving the oxide on sidewalls 20.

Figure 2A:
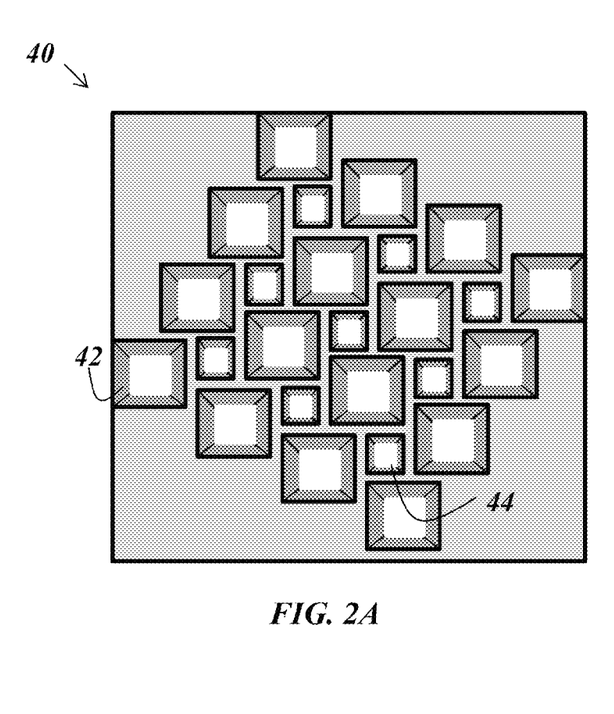
FIGS. 2A and 2B presents a pyramid-like unit cell having a flat base region.
Figure 2B:
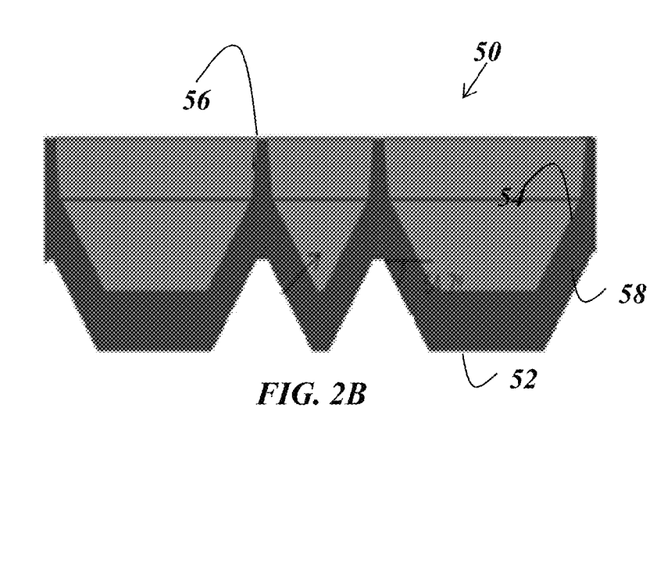

FIGS. 2A and 2B show top and cross-sectional views of 3-D TFSC substrate 40 and pyramid-like unit cell 50 having a flat base 52. FIG. 2A provides a top view of 3-D TFSC substrate 40 having larger unit cells 42 and smaller unit cells 44. These unit cells may be created in any pattern desired based on the template design. They may also be used in combination with unit cells having a different shape or size.

FIG. 2B depicts pyramid-like unit cells 50 having a flat base 52. The pyramid-like unit cell further includes tapered sidewalls 54, top-ridge 56, and backside 58. As noted earlier, tapered sidewalls 54 have a <111> crystallographic plane while top-ridges 56 have a <100> crystallographic plane, the uses of which will be important in the manufacturing processes to be discussed.

The structure presented in FIGS. 1A through 2B may be created in the template through an epitaxial growth process. An etching process creates pyramid-like unit cells 16 of FIGS. 1A and 1B having no base in the template design. A KOH etching process may be used to create pyramid-like unit cells 50 of FIGS. 2A and 2B having flat base 52 in the template design. The reader will note the template design will have reverse features from the substrate.

Now that the basic pyramid-like unit cell of the present disclosure has been discussed, four 3-D TFSC embodiments will be presented. These embodiments may be combined as desired. Further, other variations known to those having ordinary skill in the art may be used in conjunction with the novel embodiments and structures disclosed herein.

Figure 3:
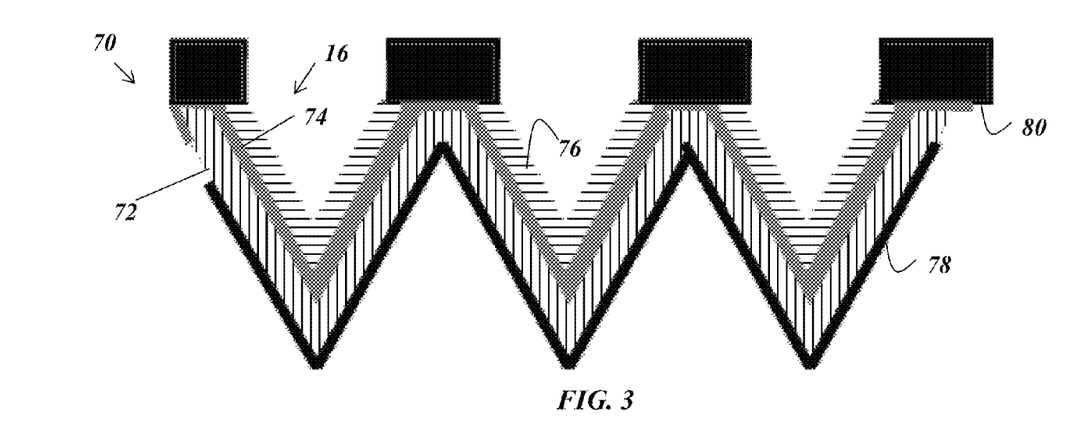
FIG. 3 gives a basic 3-D TFSC having pyramid-like unit cells.

FIG. 3 shows one embodiment of 3-D TFSC 70 having pyramidal unit cells 16 with no flat base. 3-D TFSC includes P-type substrate 72 having an in-situ doped P+ back portion. In other embodiments doping of substrate 72 may be varied. In-situ doped P+ back portion serves as the back surface field (BSF) and aids in minority carrier diffusion. 3-D TFSC 70 further includes phosphorous diffused emitter layer 74, oxide passivation layer 76, backside blanket metal contact 78, and front side metal contacts 80. It may also possible to grow the phosphorous layer in-situ as part of the epitaxial process (henceforth, the emitter). In this case, the dopant gas would have to be switched from a P-type dopant gas to an N-type dopant gas. A solar cell structure with the P+ BSF, p-base, and a N+ emitter is known as a P-type solar cell as identified by its base. In a different embodiment, an n-type solar cell can also be manufactured, where the base may be N-doped and the emitter may be a P-type dopant.

In another embodiment emitter layer 74 may be formed through a double diffusion process to form a selective emitter underneath front metal contacts 80. The selective emitter and emitter layer dopings may be optimized to reduce $J_0$ and contact resistance. However, the double-diffusion process results in a more complex process flow.

Oxide passivation layer 76 constitutes a thermal oxide layer on the tapered sidewall emitter layer 74. In another embodiment, a SiN ARC on the oxide layer may be used to reduce reflection losses and serve as a source of hydrogen, which further improves passivation. The reader will note that thermal oxide passivation layer 76 does not extend to the top-ridges of substrate 72.

Blanket metal contact layer 78 formed on backside of substrate 72 serves as a back surface reflector (or mirror). It pushes the light back in to allow it multiple chances to get absorbed in the TFSC. It also enables multiple 3-D TFSC 70 to be used in a module. In other embodiments, an oxide layer could be formed underneath metal contact layer 78, but on top of substrate 72 to form a selective back contact. This selective back contact increases efficiency by reducing the recombination loss of carriers, which is pervasive under the metal in the case of a metal silicon contact Front metal contacts 80 formed on top of emitter layer 74 and on the top-ridges of substrate 72 include a Ni/Ag stack. Other metal stacks including Ni/Cu are also entirely possible.

The basic design disclosed in FIG. 3 provides a simple and efficient 3-D TFSC 70. Other variations on the basic design may be used to increase efficiency, but with a slight increase in manufacturing complexity.

Figure 4:
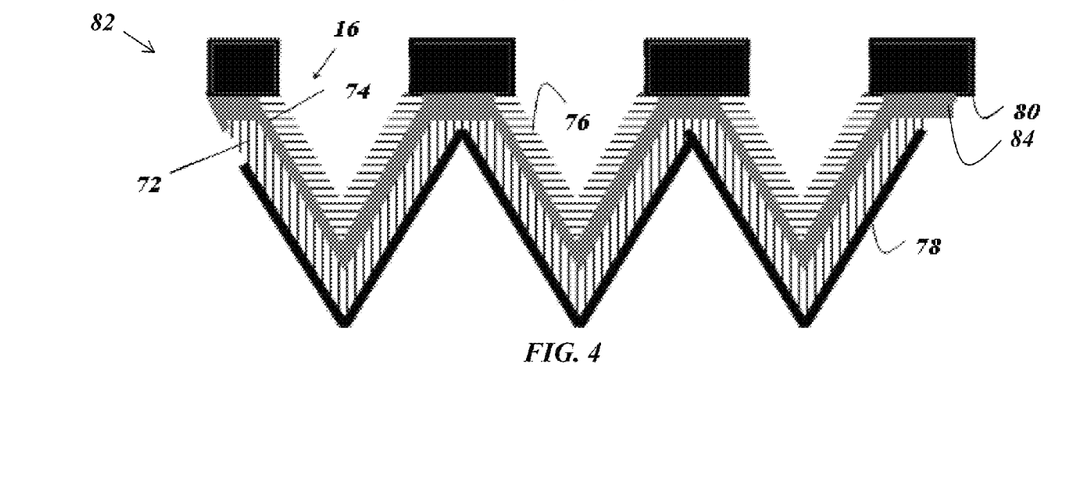
FIG. 4 discloses a 3-D TFSC having pyramid-like unit cells and a selective emitter.

FIG. 4 shows one embodiment for increasing the efficiency of the basic design disclosed in FIG. 3. FIG. 4 provides 3-D TFSC 82 having substantially similar features to 3-D TFSC 70. However, 3-D TFSC 82 further includes selective emitter regions 84 underneath metal contacts 80. The selective emitter region 84 is doped higher and deeper than the rest of the emitter region 74. This may help reduce $J_0$. Selective emitter 3-D TFSC 82 of FIG. 4 provides better efficiency than 3-D TFSC 70 by minimizing dark current $J_0$, but requires a slightly more complex process flow to form selective emitter regions 84.

Figure 5:
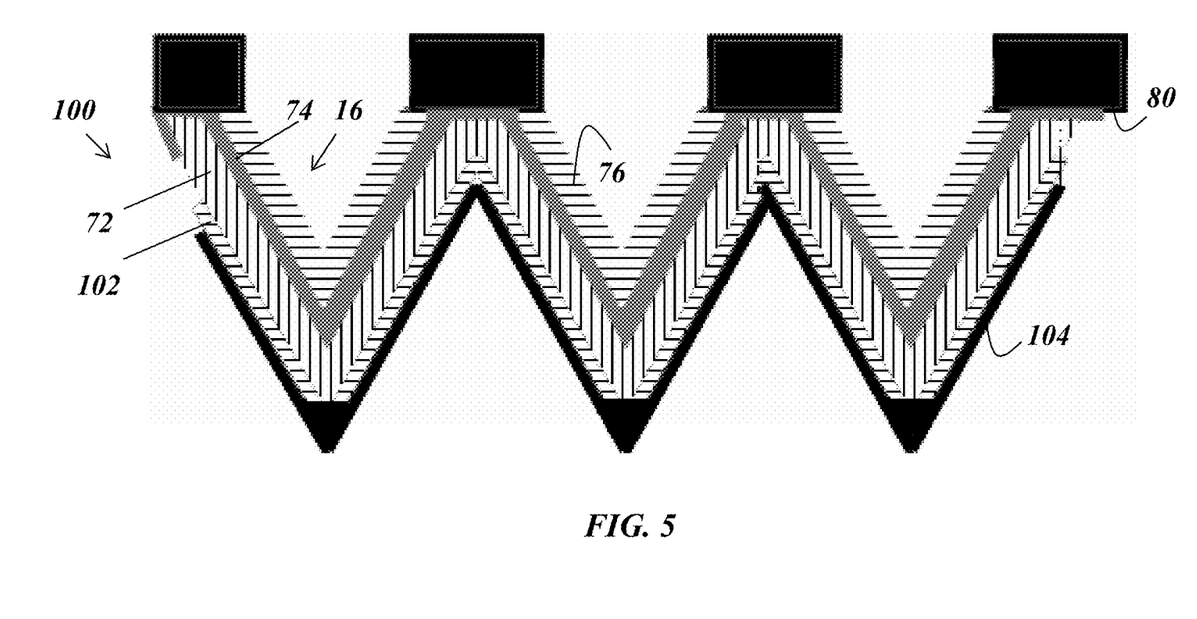
FIG. 5 provides a 3-D TFSC having pyramid-like unit cells and a selective back contact.

FIG. 5 discloses another embodiment for increasing the efficiency of the basic pyramid-like unit cell 3-D TFSC. In this embodiment, 3-D TFSC 100 includes features substantially similar to 3-D TFSC 70 of FIG. 3. However, oxide passivation layer 102 placed on the backside of 3-D TFSC substrate 72 mitigates recombination losses and increases $V_{OC}$. Further, selective back metal contact 104 contacts only a portion of 3-D TFSC substrate 72. It should be noted that this embodiment may be combined with the selective emitter embodiment of FIG. 4. Also, oxide passivation layer 102 improves the back mirror quality by placing an oxide layer between 3-D TFSC substrate 72 and metal contact 104. Oxide passivation layer 102, when taken as a stack with the metal layer, can improve metal layer 104's reflectivity b to 95%.

Figure 6:
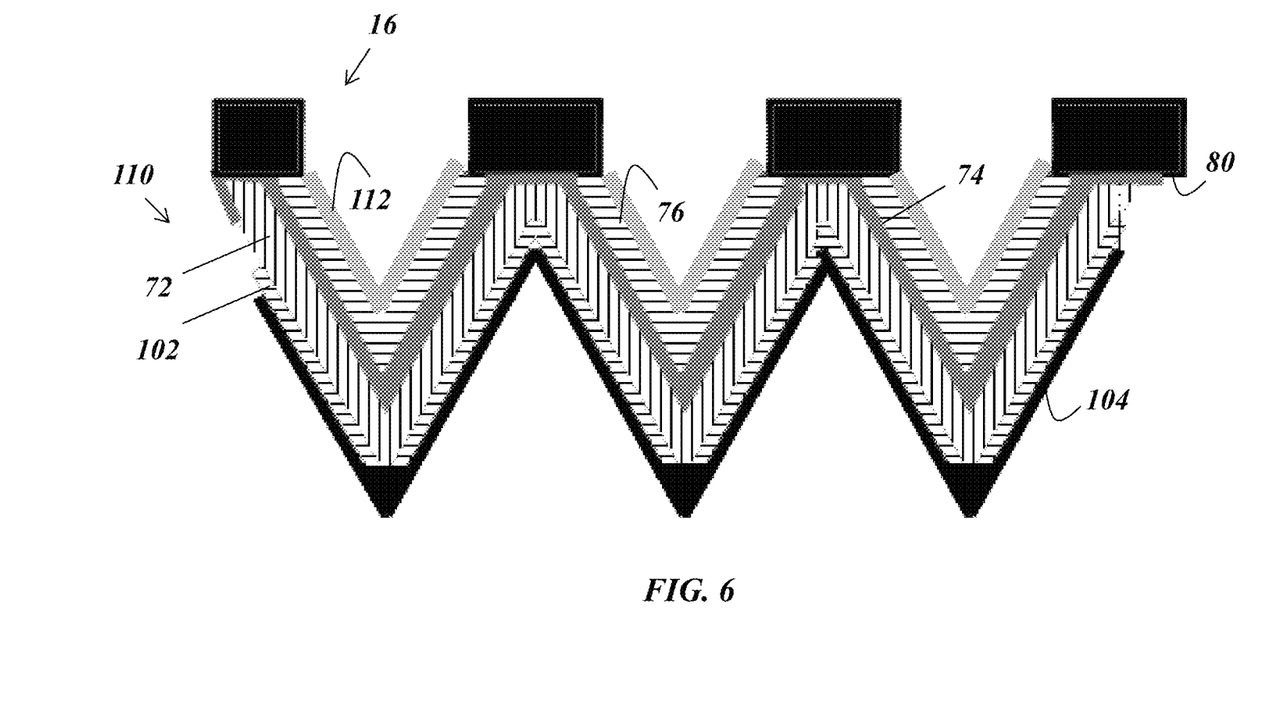
FIG. 6 shows a 3-D TFSC having pyramid-like unit cells and a SiN ARC layer.

FIG. 6 shows a fourth embodiment of 3-D TFSC 110 having SiN ARC layer 112 on oxide passivation layer 76. 3-D TFSC 110 possesses substantially similar features to 3-D TFSC 100 of FIG. 5 except 3-D TFSC 110 also provides SiN ARC layer 112 on oxide passivation layer 76. It should be noted that this embodiment could also be produced without selective back metal contact 104 and back oxide passivation layer 102. The plasma-enhanced chemical vapor deposition (PECVD) SiN ARC layer 112 above oxide passivation layer 76 serves two purposes. First layer 112 reduces light reflection boosting efficiency thereby increasing the short circuit current, $J_{SC}$. Next, the SiN ARC layer serves as source of hydrogen to passivate the surface more effectively thereby increasing $V_{OC}$.

The embodiments of FIGS. 1A through 6 may be formed individually or used in combination to increase efficiency as needed. As noted earlier, other unit cell structures and designs could be used in combination with the structures of FIGS. 1A through 2B as well.

Having discussed various 3-D TFSC and structures, the disclosure now presents four novel methods for manufacturing these novel 3-D TFSC.

Figure 7:
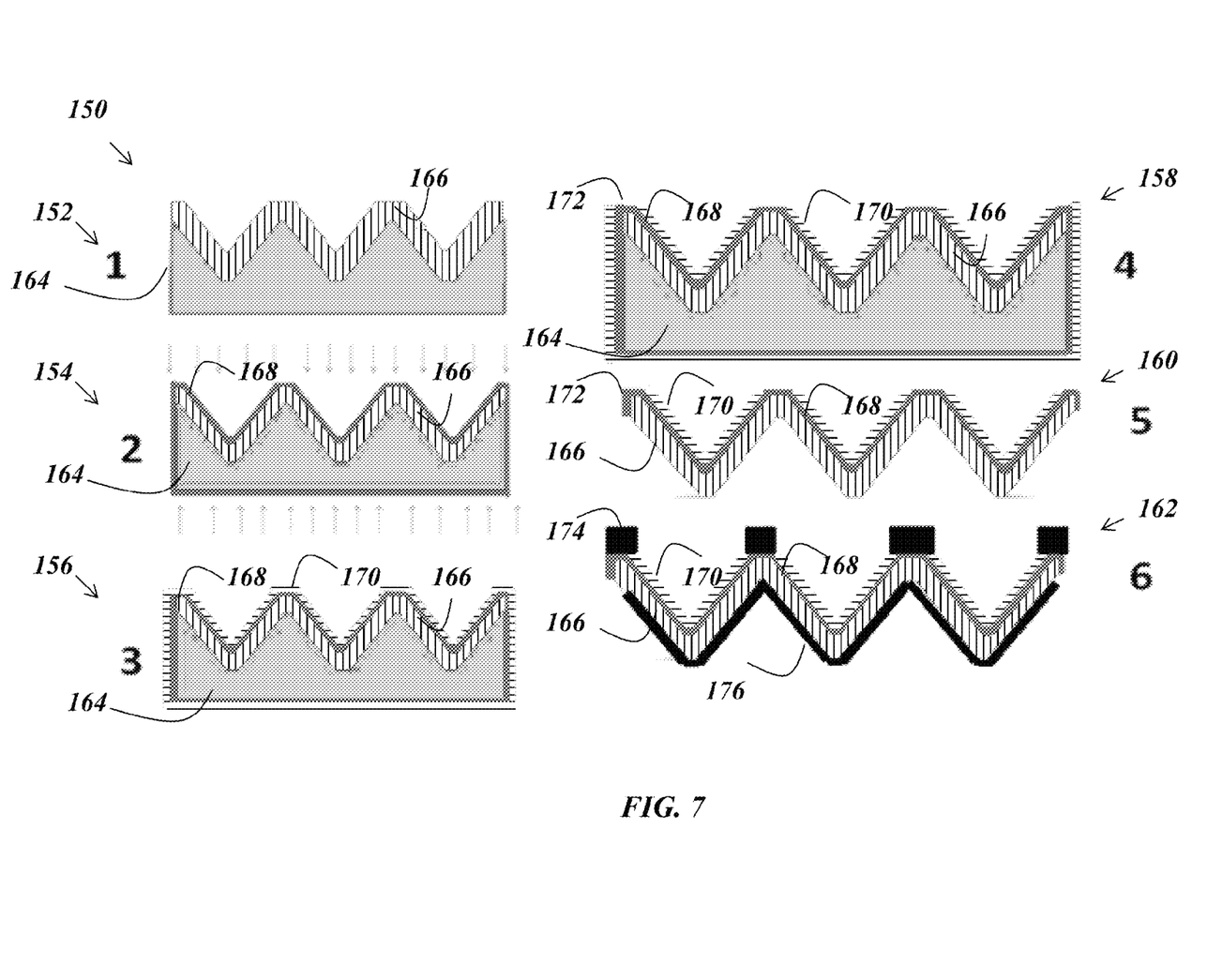
FIG. 7 pictorially depicts a tip-etch process flow for forming novel 3-D TFSC of the present disclosure.

One embodiment shows basic process flow 150 for manufacturing 3-D TFSC 70 of FIG. 3. FIG. 7 discloses tip-etch process flow 150 for manufacturing a 3-D TFSC. First, a KOH etch process creates template 164. The template includes reverse features of the 3-D TFSC substrate 166 which it forms. A bi-layer porous silicon layer formed on template 164 eventually creates substrate 166. First, a high-porosity porous silicon layer formed on the template will eventually serve as the release layer. Next, a low-porosity porous silicon layer facilitates high quality epi-growth. A high quality epitaxial silicon layer grown on top the low-porosity porous silicon layer forms the substrate. The first portion of the epitaxial silicon layer will be an in-situ P+ boron doped layer which serves as the back surface field. Next, a standard P-layer is grown on the P+ layer. In one embodiment, the doping may be on the order of 1e16 $cm^{-3}$. Other suitable doping concentrations could also be used. In other embodiments, the doping may be varied to aid in minority carrier diffusion through the built-in electric field. It may also be entirely possible to not use the backside surface field, if desirable. Thus the P+ and P-layer form substrate 166. Substrate 166 may be from few microns to greater than 100 microns thick.

In step 154, a POCL based process forms emitter layer 168 on substrate 166. The POCL process employs gas-phase phosphorous diffusion to form emitter layer 168. It is important to note that this process is performed inside template 164 greatly increasing yield. This points to the generic advantage of processing more cell steps inside the template. Processing inside template 164 enables two advantages. First, the backside of substrate 166 would ordinarily need to be protected, either by backside oxidation or SiN deposition, to keep from counterdoping the in-situ back surface field. However, in tip-etch process flow 150 of FIG. 7 template 164 protects the backside of substrate 166. Further, template 164 provides mechanical support to substrate 166 during processing increasing yield. Thus, processing substrate 166 in template 164 reduces process steps and increases yield. The processing may require cleaning of the backside of the template which will be discussed in greater detail later in the present disclosure.

The emitter may also be formed using other known processes such as a PSG process. Also, in-situ doping in the epi chamber could be used to form emitter layer 168. This will constitute either flowing phosphine during epi growth of the final layers, thus relying on in-situ doping or stopping gas having silicon (TCS, DCS, or silane), while continuing to flow the dopant gas.

Step 156 creates oxide passivation layer 170 on emitter layer 168 including on top-ridges, however oxide on the top-ridges of emitter layer 168 will be etched back in step 158. Step 156 creates layer 170 to reduce surface recombination but the thermal budget also aids in driving the phosphorous and boron doping into substrate 166. Appropriate oxidation conditions such as time and temperature should be chosen to drive boron and phosphorous dopants into substrate layer 166. It should be noted step 158 enables two critical advantages similar to process step 156. First, since step 156 oxidized substrate 166 in template 164, process steps of traditional process flows are reduced. For example, the backside of substrate 166 will not be oxidized since it is protected by template 164, thus oxidation on the backside of substrate 166 need not be etched back to form a metal contact on the backside. Also, template 164 provides support to substrate 166 during processing. The template could be an eight (8) inch wafer in one embodiment. Other sizes may also be used.

In step 158 a tip-etch process removes oxide passivation from the top-ridge of substrate 166, producing top-ridges having only emitter 172. Tip-etch step 158 may be done via several methods.

First, a wet HF timed etch may selectively remove oxide from the top-ridges of the substrate. As noted earlier, during oxide passivation step 156, <111> planes on sidewalls of the substrate will lead to thicker oxides on the sidewalls than on the <100> planes of the top-ridge. Thus, a timed etch could remove the oxide on the top-ridge portion while leaving oxide on the sidewalls.

Next, a dry plasma etch could also be used to remove the oxide. This embodiment exploits the fact that the tapered sidewalls will etch slower than the top-ridge, since the plasma flux impacts the top-ridge at normal incidence.

Another embodiment relies on a LOCOS process and the poor step coverage of PECVD SiN. This embodiment follows a slightly different sequence after step 154 (POCL) above. A poor step coverage PECVD SiN is deposited before oxidation in step 156. This is followed by an etch-back in hot phosphoric or HF to have SiN only on the tips and ridges. Subsequently, oxidation (step 156 above) is performed. Oxide gets everywhere on the sides as passivation, except on the top of the ridges. Finally, SiN is selectively removed from the tips using a wet or dry etch which is selective to oxide. Although, above is a specific material set of oxide/nitride which yields this possibility, in general any material set which satisfies the requirement of SiN (low step coverage, oxidation blocker, and selective etch to Oxide) can be used in this technique.

A release process Step 160 releases substrate 166 from template 164. In an embodiment this release can be either chemical mechanical release (CMR). In a different embodiment this can be Sonicated mechanical release (SMR) or Mechanical release (MR). Step 160 selectively etches the sacrificial porous silicon bi-layer described above. Other mechanically weak layers may be substituted instead of the porous silicon bi-layer described. Several techniques including a wet etch, purely mechanical breakage, or a combination may be used to release substrate 166 from template 164. Before the release, several techniques such as dicing, laser cutting, or mechanical breakage may be used to demarcate the substrate edge from the template.

Next, step 162 forms front 174 and backside 176 metal contacts on substrate 166. It should be noted that front contacts and metallization 174 may be performed before substrate release step 160. A sputtering process forms an Al backside metal contact 176 while a selective metal plating process forms Ni/Ag stack front contacts 174 on the top-ridges of substrate 166. The plating on the front may be either electrolytic, electroless, or light induced plating (LIP) or a combination for Ni, Ag and Cu. Thus, tip-etch process flow 150 may create 3-D TFSC 70 of FIG. 3.

Figure 8:
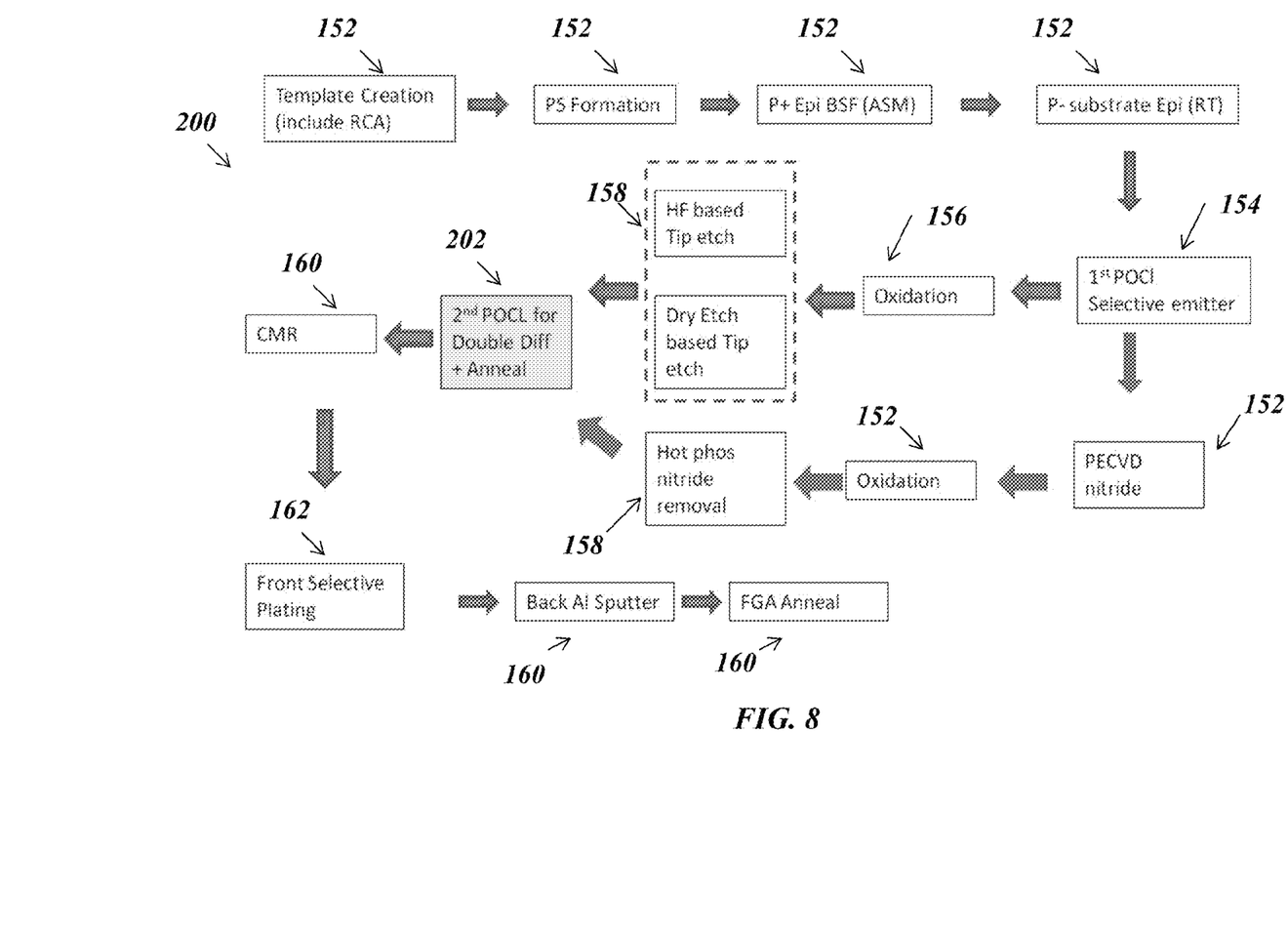
FIG. 8 gives a process flow for forming novel 3-D TFSC of the present disclosure.

To form a selective emitter double-diffusion process flow 200 shown in FIG. 8 may be used. Double-diffusion process flow 200 represents one variant to tip-etch process flow 150. Steps 152, 154, 156, 158, 160, and 162 of process flow 200 represent substantially similar steps as described in tip-etch process flow 150. In fact, double-diffusion process flow may be added to the LTC process flow to be described.

Another POCL step 202 performed after tip-etch 158 forms selective emitter 84 of FIG. 4. Process flow 200 performs POCL step 202 in the template to reduce substrate breakage concerns. The POCL condition may be varied from step 154 to give a high doping in the emitter thereby reducing minority carrier recombination under the metal contact and improving contact resistance.

In a slight variation of the above flow, a short KOH etch may follow either POCL step 202 (for double diffusion structure) or tip etch step 158 for the single diffusion structure. The KOH etch provides two main advantages. First, the second etch step aids in roughening silicon on the top-ridges which will aid in front metal contact adhesion during plating. Second, the KOH etch helps remove the back phosphorous layer on the template. The reader will note the second advantage only arises if the tip etch step 158 follows the wet etch process flow since the oxide on the backside of the template must be etched.

The novel processes of FIGS. 7 and 8 provide several advantages. First, the template provides mechanical support to the TFSS during processing thereby increasing yield. This process is in stark contrast to conventional 3-D TFSC solar cell processing. Next, the template protects the backside of the substrate from processing, mitigating the need for processing steps to protect the backside of the substrate. Another advantage arises from the different oxidation rates on different crystallographic orientations. The sidewalls having a <111> crystallographic orientation produce a thicker oxide layer than the top-ridge having a <100> crystallographic orientation. A timed HF etch may selectively remove oxide from the top-ridges while leaving passivation on the sidewalls. Also, since no flat-base portion exists a blanket tip etch may be used. In the prism structure of the '490 application the flat-base portion may need to be covered with resist.

To obtain the SiN ARC layer 112 of FIG. 6, a SiN ARC formation step follows thermal oxidation step 156 of process flows 150 and 200. Subsequently tip-etch step 158 would be used to etch the SiN ARC layer and oxide layer. In one embodiment dry plasma etch step 158 may be used. Because the ion flux in the plasma is angle dependent, the top-ridges which are perpendicular to the ions will see more flux (due to the cosine factor) than the sidewalls of the pyramid structure. Thus, the nitride/oxide stack on top-ridges will etch faster. In another embodiment, a combination of the dry and wet etches may be used. This may include dry etching SiN only or SiN plus some of the oxide, followed by a wet etch of the remaining oxide. It should be noted that only a pointed base (i.e. not flat base) structure must be used to ensure no <100> plane exists at the base.

Figure 9:
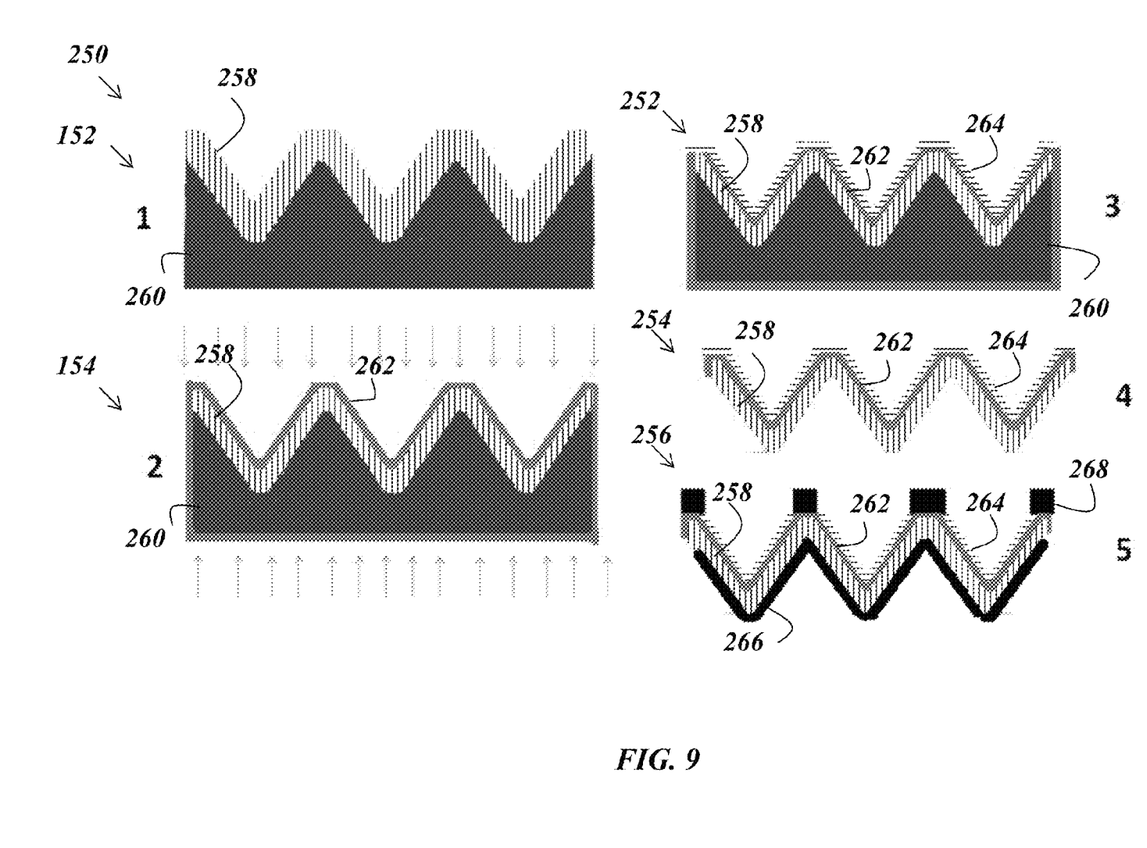
FIG. 9 pictorially depicts a Ag fire through process flow for forming novel 3-D TFSC of the present disclosure.

FIG. 9 presents Ag fire through process flow 250. Process flow 250 may be used to create the selective back metal contact of FIG. 5 and/or SiN arc layer 112 of FIG. 6. In this variation a SiN ARC layer is used as the passivation instead of a thermal oxide layer. A blanket or selective metal contact may be formed on the backside.

Steps 152 and 154 represent similar steps as described heretofore. Step 152 forms substrate 258 on template 260. Step 154 forms emitter layer 262 on substrate 258.

Next, step 252 selectively deposits SiN layer 264 on the front of substrate 258. This may be achieved using a PECVD process. Further, no SiN deposition occurs on template 260 sides or base. Step 254 releases substrate 258 from template 260. In step 256, an Ag paste selective applied on substrate 258 top-ridges forms front metal contacts 268. The Ag paste may be applied via roller coating or a screen printing process. A fire through process follows the coating to ensure the Ag front metal contacts 268 punch through SiN layer 264 and contacts doped silicon emitter layer 262.

An Al back sputter coats the backside surface with backside blanket metal contact 266. An optional FGA anneal may be tried on these cells after backside Aluminum. Note, alternate metal schemes such as plating Ni/Ag stack on the back to make it solderable in a module as well as on the front to make it thicker, may also be applied subsequently.

Ag fire through process 250 works well for both structures 1A through 2B having no flat base and having flat base. Tip-etch flow 150 and double-diffusion flow 200 described in FIGS. 7 and 8 works for 3-D TFSC substrates having no flat base. However, a slight efficiency compromise may result for substrates having a flat base due to effects described heretofore. Also, the LOCOS route for tip-etch process flow 150 and double-diffusion process 200 will work for both substrates.

Ag fire through flow 250 may be expanded to produce a selective back metal contact and dielectric mirror on the backside. This structure corresponds to FIG. 5. Two distinct processes may be used to form the selective back metal contact of FIG. 5.

Figure 10:
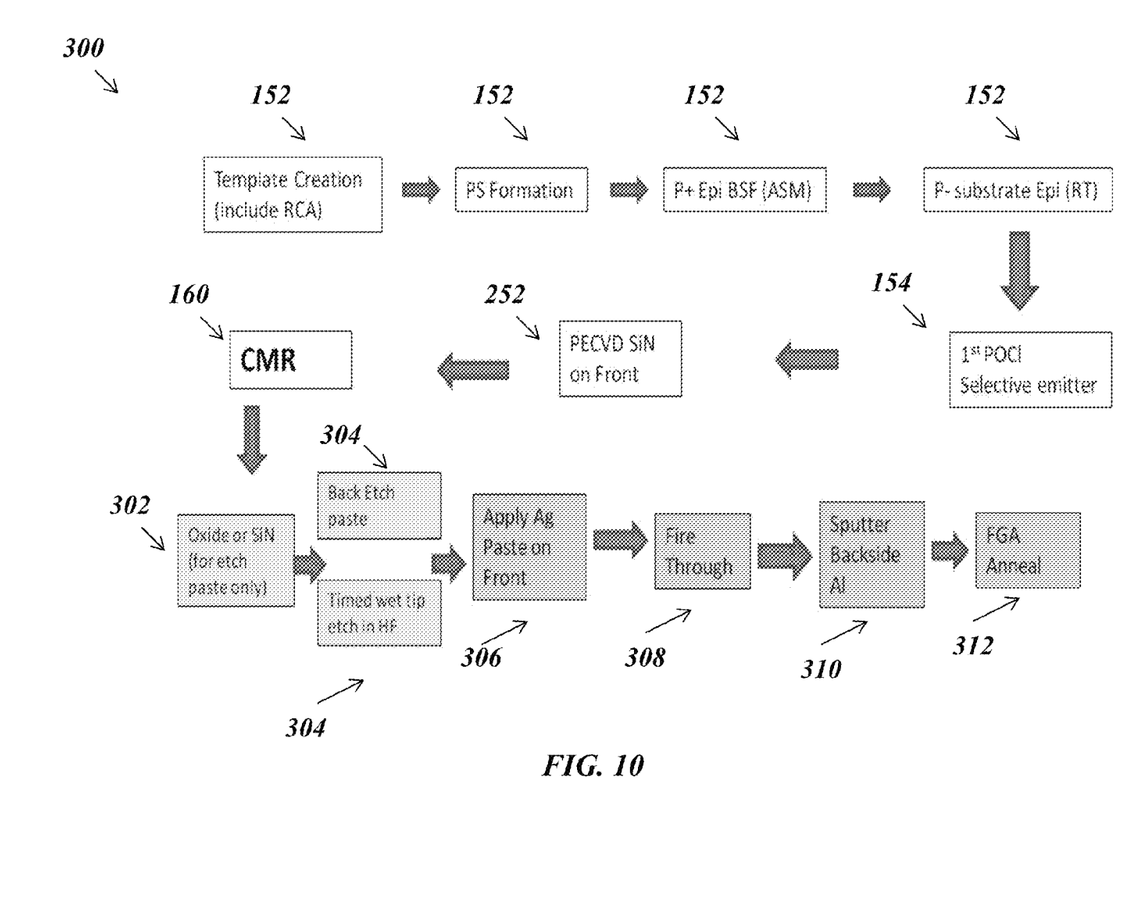
FIG. 10 gives a process flow for forming novel 3-D TFSC of the present disclosure.

FIG. 10 shows both embodiments for creating the selective back metal contact of FIG. 5. Process flow 300 shows steps 152, 154, 252, and 160 substantially similar to process steps described heretofore. Step 160 releases the substrate from the template using a CMR, SMR or MR process. In step 302, a thin oxidation or PECVD SiN forms the backside mirror. Other variations may include an LPCVD SiN process. Next, step 304 selectively removes the SiN on the backside contacts. Step 306 screen prints Ag paste on the front. In step 308 the contacts of fired through to make contact with the silicon. Next, in step 310 a sputtering process deposits Al on the backside. Al contacts the substrate only on areas where the etch paste has opened the contact. These steps, then, could be followed by FGA anneal step 312 and/or further plating both on front and/or back to make the metal thicker and solder compatible, respectively.

Another embodiment requiring flat base may proceed as follows. Step 302 forms an oxide layer on the backside only since the front side is protected by the SiN layer. A timed wet HF dip in step 304 selectively removes the oxide on the back layer since the flat base has a <100> (thinner oxide) backside. Thus, step 304 opens the backside for contacting with metal. Next, steps 306 through 312 may be followed as desired.

Figure 11:
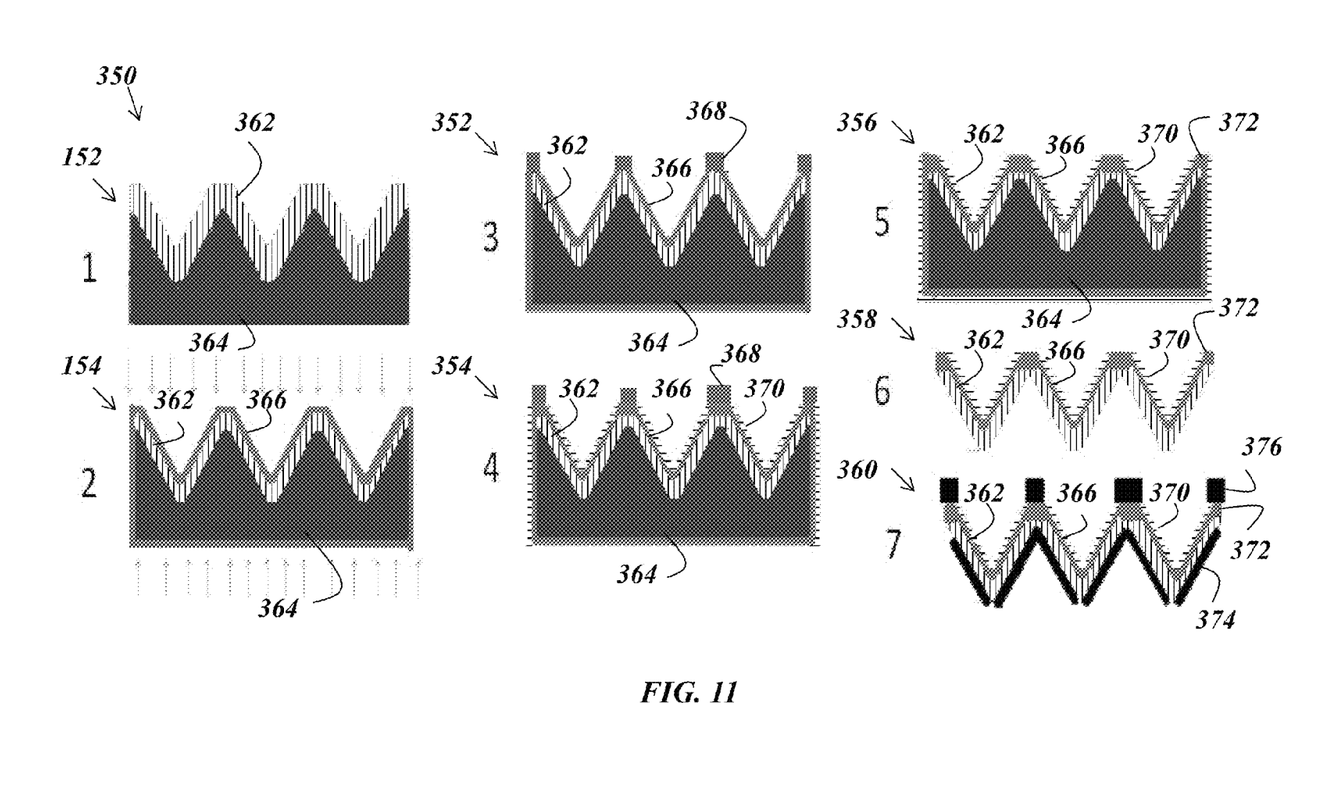
FIG. 11 pictorially depicts an LTC process flow for forming novel TFSC of the present disclosure.

A liquid transfer coating (LTC) process may create 3-D TFSC of FIGS. 4 through 6. FIG. 11 pictorially depicts LTC process flow 350 for creating 3-D TFSC 82 of FIG. 4.

LTC process flow 350 begins with process steps 152 and 154 these steps represent substantially similar process steps of tip-etch process flow 150 (FIG. 7) and Ag fire through process flow 250 (FIG. 9). Step 152 forms p-type substrate 362 on template 364 as explained heretofore. Step 154 forms emitter layer 366 on substrate 362. The reader will note emitter layer 362 also extends around template 364. Cleaning the template will be addressed later in the present disclosure. In an embodiment, the emitter may also be grown in-situ as part of the epitaxial growth process.

In step 352, a roller coating or screen printing process coats dopant 368 on top ridges of substrate 362 on top of emitter 366. Oxidation step 354 has multiple functions. First, oxidation step 354 forms oxidation layer 370 on emitter layer 366 except on top-ridges of substrate 362. Oxidation step 354 also drives phosphorous and boron dopants into substrates 362 as explained earlier in the present disclosure. Next, oxidation step 354 drives dopant 368 into emitter layer 366 forming a heavily doped region on top-ridges of substrate 362. Finally, the reader will note that since oxidation step 354 oxidizes substrate 362 in template 364 outdiffusing does not pose the risk of counterdoping the boron doped BSF.

Oxidation step 354 requires other features. First oxide layer 370 should not extend underneath dopant 368. Secondly, very little dopant from the solid source should go into the gas phase and contaminate the optimized dopant profiles for selective emitter 372. Thirdly, the dopant should be selectively etched away compared to the passivation One way to get around these problems is to double coat on top of the dopant material. The second coat should be a material which satisfies all the above criteria. Either $TiO_2$ or $TaO_2$ may serve this purpose. Other materials meeting these requirements may also be used.

In step 356, a selective wet etch process etches dopant 368 while leaving oxide layer 370 intact. In step 358 one of CMR, SMR or MR process releases substrate 362 from template 364. Step 360 forms front metal contacts 376 and blanket back metal contacts 374 on substrate 362. Thus, LTC process flow 350 creates 3-D TFSC 82 of FIG. 4. The reader will note that front metal contacts 376 may be formed while substrate 362 is still in template 364, if template 364 can be cleaned or kept defect free.

LTC process flow 350 of FIG. 11 may be expanded to produce selective backside metal contact 3-D TFSC 100 of FIG. 5 and/or SiN ARC layer 110 of FIG. 6.

Tip-etch flow 150 (FIG. 7) and the LTC flow 350 (FIG. 11) may follow the same process steps as Ag fire through flow 250 (FIG. 9) to add selective back metal contact 104 (FIG. 5) instead of blanket back metal contact 78 (FIG. 3).

Two techniques were disclosed. Referring back to FIG. 10, after release step 160, oxidation step 302 forms an oxide layer on the backside of the substrate. An etch paste then selectively removes the oxide from selected areas of the substrate. The backside metal contact then directly contacts the substrate in these selected areas.

In the second technique a thinner oxide forms on the backside <100> areas of the truncated pyramid compared to the crystallographic <111> plane. Subsequently, a wet etch can be used to open the contact areas. One key difference in tip-etch process 150 and LTC process 350 compared to Ag fire through process 250 is that with the last process of oxidation, the oxide thickness has to be smaller than the front passivation, as the oxide on the front should be preserved.

Table 1 below succinctly summarizes processes used to create various 3-D TFSC embodiments and their corresponding figures.

TABLE 1

Processes used to create 3-D TFSC substrate embodiments
Final Pyramid Structures and Processes

|  | Tip-Etch (FIG. 7) | Ag Fire Through (FIG. 9) | LTC (FIG. 11) |
| --- | --- | --- | --- |
| Basic (FIG. 3) | X | X |  |
| Selective Emitter (FIG. 4) | X |  | X |
| Selective Back Metal Contact (FIG. 5) | X | X | X |
| SiN ARC Frontside (FIG. 6) | X | X | X |

The present disclosure further contemplates other generally applicable methods for increasing manufacturing throughput. These methods do not restrict their implementation to pyramid structures or other embodiments disclosed herein, but may be applied to any 3-D TFSC involving a template.

Figure 12:
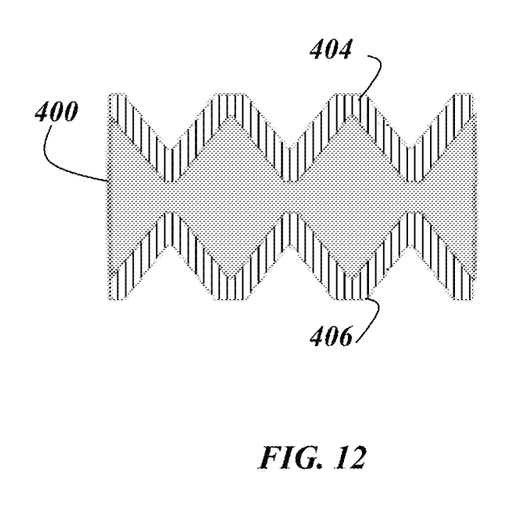
FIG. 12 presents a dual sided template.

In one embodiment, a dual sided template enables processing on both sides of the template. This approach processes two substrates simultaneously. FIG. 12 provides an exemplary depiction of such an embodiment. FIG. 12 depicts template 400 having substantially similar feature sets on opposite sides. Template 400 forms two (2) substrates 402 and 404 on each side. Subsequently, substrates 402 and 404 may be processed simultaneously until released.

Double sided template 400 effectively doubles manufacturing capacity. Further, each template may produce double the number of substrates reducing its cost/substrate ratio. Also, since two porous silicon substrates may be formed on the same template at the same time, template 400 minimizes waste and reduces chemical consumption.

Dual sided template 400 is applicable to processes disclosed in the present disclosure. Thus, after the porous silicon and the epi-process steps, gas phase phosphorous doping for the emitter (whether through POCL or in-situ in the epi-chamber) can be done on both sides of the template at the same time. In fact, this will improve the throughput or for the same throughput would reduce the cap ex of POCL furnaces by half.

For tip etch process 150, dual sided template 400 may be used for oxidation step 156 of FIGS. 7 and 8. Next, oxide removal step 158 may also be performed on dual sided template 400 if wet HF process performs selective oxide removal step 158. If dry etch process performs step 158 than the selective oxide removal must be performed in two runs, one for each side. CMR process 160 separates both substrates 402 and 404 from template 400 in one step. If a selective emitter or dual junction must be created, a $2^{nd}$ POCL step 202 forms the selective emitter on both substrates in one run.

Ag fire through processes 250 and 300 of FIGS. 8 and 9 may also employ dual sided template 400 of FIG. 12. Two separate steps perform PECVD step 254, one step for each side. A dual CMR process releases both substrates 402 and 404 from template 400. In another embodiment and LPCVD SiN can be used which deposits SiN on both sides of the template at the same time.

For LTC flow 350 of FIG. 11, following POCL step 154, roller coating or screen printing step 352 must be performed on both sides. Remaining steps 354 through 358 may be used in conjunction with the dual sided template.

As noted earlier, the present disclosure enables substrate processing inside a template. This feature not only provides mechanical support to the substrate, increasing yield, but also reduces process steps for protecting the backside of the substrate. However, since the template will be reused for processing other substrates, defects and damages to the substrate must be kept at a minimum. To address these concerns, the following discussion provides a list of interactions as a result of process steps and solutions for mitigating damage to the template.

A POCL step forms an emitter in the substrate in tip-etch, Ag fire through, and LTC process flows. In the single sided template version of the processes, POCL contaminates the sides and back of the template. The phosphorous used to form the emitter may counter dope the boron doped template. One solution allows two single sided templates to be processed back-to-back in a POCL tube. In this manner, phosphorous will not counter dope the template.

As far as re-use, phosphorous on the template presents two main concerns. First, would this phosphorous hinder porous silicon formation for the next re-use? Since the porous silicon formation process requires positively biasing the backside of the template, this is not an issue. If a heavily doped phosphorous layer exits on the template backside, a reverse bias P+/N+ junction forms on the back. Because of heavy doping and large bias, this junction will exhibit zener breakdown, presenting very little resistance to hole flow to the surface to form porous silicon. Thus, this issue is not a problem.

The epitaxial growth of the substrate, however, may feel repercussions of the heavily phosphorous doped template backside. The Dual-sided mother template does not suffer from this problem as phosphorous containing layers on both sides are active layers, hence are removed with the substrate release.

First, if the auto-doping to the backside of the template presents a problem for the epitaxial-growth step, standard epi chamber techniques seal the backside using HCl and chuck coating. In another embodiment, an etching process removes the phosphorous dopant from the backside of the template before the epitaxial growth step.

Two etching processes may be used. First, for tip-etch process flow 150 of FIG. 7 and LTC flow 350 of FIG. 11, an added step after oxidation step 156 and 354 respectively performs template backside dry oxide etch followed by KOH etch to remove silicon.

For Ag fire through flow 250 of FIG. 9 a KOH etch on template backside removes the phosphorous dopant after SiN deposition step 356 and before substrate release step 358. This will protect the front side, while removing the phosphorous doped silicon layer in the back.

Further, LTC process flow applies dopant 368 to top-ridges of substrate 362 in step 352. Typically, dopant 368 includes some trace metals. The substrate must be cleaned before the next re-use cycle.

In summary, the present disclosure enables high-volume cost effective production of three-dimensional thin film solar cell (3-D TFSC) substrates. First, the present disclosure discloses pyramid-like unit cell structure 16 and 50 which enable epitaxial growth through their open pyramidal structure. The present disclosure than gives four 3-D TFSC embodiments 70, 82, 100, and 110 which may be combined as necessary. A basic 3-D TFSC having a substrate, emitter, oxidation on the emitter, front and back metal contacts allows simple processing. Other embodiments disclose a selective emitter, selective backside metal contact, and front-side SiN ARC layers. Several processing methods including process flows 150, 200, 250, 300, and 350 enable production of these 3-D TFSC. Further, the present disclosure enables higher throughput through the use of dual sided template 400. By processing the substrate in the template, the present disclosure increases yield and reduces processing steps.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A pyramidal three-dimensional thin film solar cell (3-D TFSC) having enhanced processing properties, comprising:

an n-type epitaxial 3-D TFSC substrate comprising a plurality of pyramidal unit cells, wherein said unit cells comprise:
  tapered sidewalls having different crystallographic planes including the <111> plane, said tapered sidewalls forming an open pyramid-like structure;
  a substantially flat top-ridge having a crystallographic <100> plane, said top-ridge associated with said tapered sidewalls; and
  said tapered sidewalls having a backside surface; and
said 3-D TFSC substrate further comprising a back n+ doped layer;
a single p-type dopant diffusion emitter layer formed in said tapered sidewalls and said top-ridge;
an oxide passivation layer formed on said emitter layer, said oxide passivation layer formed on said tapered sidewalls;
a blanket metal contact layer formed on said back surface; and
front metal contacts formed on said emitter layer, said front metal contacts formed on said top-ridge.

2. The 3-D TFSC of claim 1 wherein said n+ doped layer further comprises in-situ doped n+ layer.

3. The 3-D TFSC substrate of claim 1, wherein said n-type epitaxial substrate doping is varied.

4. The 3-D TFSC substrate of claim 1, wherein said n type epitaxial substrate doping is constant.

5. The 3-D TFSC substrate of claim 1, further comprising a silicon substrate.

6. The 3D TFSC substrate of claim 1, wherein the p+ dopant layer comprises an in-situ emitter.

7. A pyramidal three-dimensional thin film solar cell (3-D TFSC) having enhanced processing properties, comprising:
  an n-type epitaxial 3-D TFSC substrate comprising a plurality of pyramidal unit cells, wherein said unit cells comprise:
    tapered sidewalls having a crystallographic <111> plane, said tapered sidewalls forming an open pyramid-like structure;
    a substantially flat top-ridge having a crystallographic <100> plane, said top-ridge associated with said tapered sidewalls; and
    said tapered sidewalls having a back surface; and
  said 3-D TFSC substrate further comprising a back n+ doped layer;
  a p-type dopant diffusion emitter layer formed in said tapered sidewalls;
  a p-type dopant diffusion selective emitter layer formed in said top-ridge;
  an oxide passivation layer formed on said emitter layer, said oxide passivation layer formed on said tapered sidewalls;
  a blanket metal contact layer formed on said backside surface; and
  front metal contacts formed on said emitter layer, said front metal contacts formed on said top-ridge.

8. The 3-D TFSC substrate of claim 7, wherein said selective emitter layer is doped less heavily than said emitter layer.

9. The 3-D TFSC substrate of claim 7, wherein said n+ doped layer is in-situ doped.

10. The 3-D TFSC substrate of claim 7, wherein said p type n-type epitaxial substrate doping is varied.

11. The 3-D TFSC substrate of claim 7, wherein said p typo n-type epitaxial substrate doping is constant.

12. The 3-D TFSC substrate of claim 7, further comprising a silicon substrate.

13. The 3-D TFSC substrate of claim 7, further comprising a SiN ARC layer formed on said oxide passivation layer.

14. A pyramidal three-dimensional thin film solar cell (3-D TFSC) having enhanced processing properties, comprising:
  an n-type epitaxial 3-D TFSC substrate comprising a plurality of pyramidal unit cells, wherein said unit cells comprise:
    tapered sidewalls having a crystallographic <111> plane, said tapered sidewalls forming an open pyramid-like structure;
    a substantially flat top-ridge having a crystallographic <100> plane, said top-ridge associated with said tapered sidewalls; and
    said tapered sidewalls having a backside surface; and
  said 3-D TFSC substrate further comprising a back n+ doped layer;
  a p-type dopant diffusion emitter layer formed in said tapered sidewalls and said top-ridge;
  an oxide passivation layer formed on said emitter layer, said oxide passivation layer formed on said tapered sidewalls;
  a complete passivation layer formed at least partially on said backside surface;
  a selective metal contact layer formed on said complete passivation layer on said back surface, said selective metal contact at least partially contacting said n-type epitaxial 3-D TFSC; and
  front metal contacts formed on said emitter layer, said front metal contacts formed on said top-ridge.

15. The 3-D TFSC substrate of claim 14, wherein said emitter layer further comprises a selective emitter layer formed in said top-ridge.

16. The 3-D TFSC substrate of claim 15, wherein said selective emitter layer is doped less heavily than said emitter layer.

17. The 3-D TFSC substrate of claim 14, wherein said n+ doped layer further comprises an in-situ doped n+ layer.

18. The 3-D TFSC substrate of claim 14, wherein said n-type epitaxial substrate doping is varied.

19. The 3-D TFSC substrate of claim 14, wherein said n-type epitaxial substrate doping is constant.

20. The 3-D TFSC substrate of claim 14, further comprising a silicon substrate.

21. The 3-D TFSC substrate of claim 14, further comprising a SiN ARC layer formed on said oxide passivation layer.

* * * * *